(12) United States Patent
Tsai et al.

(10) Patent No.: US 7,707,521 B2
(45) Date of Patent: Apr. 27, 2010

(54) LAYOUT ARCHITECTURE HAVING HIGH-PERFORMANCE AND HIGH-DENSITY DESIGN

(75) Inventors: Yu-Wen Tsai, Hsinchu (TW); Jeng-Huang Wu, Hsinchu County (TW)

(73) Assignee: Faraday Technology Corp., Hsin-Chu (TW)

( * ) Notice: Subject to any disclaimer, the term of this patent is extended or adjusted under 35 U.S.C. 154(b) by 647 days.

(21) Appl. No.: 11/560,838

(22) Filed: Nov. 17, 2006

(65) Prior Publication Data

US 2008/0022245 A1     Jan. 24, 2008

(30) Foreign Application Priority Data

Jul. 20, 2006    (TW)  ............................... 95126495 A

(51) Int. Cl.
    *G06F 17/50*     (2006.01)
(52) U.S. Cl. .................................. 716/1; 716/8; 716/17
(58) Field of Classification Search ...................... 716/1, 716/8, 14, 17
See application file for complete search history.

(56) References Cited

U.S. PATENT DOCUMENTS

| | | | | |
|---|---|---|---|---|
| 5,313,079 | A * | 5/1994 | Brasen et al. | ............... 257/206 |
| 6,838,713 | B1 * | 1/2005 | Gheewala et al. | ............ 257/211 |
| 6,903,389 | B1 * | 6/2005 | Tai et al. | ...................... 257/202 |
| 7,129,562 | B1 * | 10/2006 | Gheewala et al. | ............ 257/574 |
| 7,219,324 | B1 * | 5/2007 | Sherlekar et al. | ............... 716/12 |
| 2002/0127786 | A1 * | 9/2002 | Liaw | ............................ 438/153 |
| 2003/0207523 | A1 * | 11/2003 | Liu et al. | ...................... 438/200 |
| 2003/0211663 | A1 * | 11/2003 | Min et al. | ..................... 438/148 |
| 2005/0083765 | A1 * | 4/2005 | Jeong et al. | ............. 365/230.05 |
| 2005/0253143 | A1 * | 11/2005 | Takaura et al. | ................. 257/67 |
| 2007/0180419 | A1 * | 8/2007 | Sherlekar et al. | ................ 716/9 |
| 2008/0217786 | A1 * | 9/2008 | Kasaoka et al. | .............. 257/773 |

\* cited by examiner

*Primary Examiner*—Jack Chiang
*Assistant Examiner*—Suchin Parihar
(74) *Attorney, Agent, or Firm*—Winston Hsu

(57) ABSTRACT

A layout architecture having high-performance and high-density design used in a standard cell integrated circuit is provided. The layout architecture includes a substrate, a first conductor, a second conductor, a third conductor, a fourth conductor, a first device region, a second device region, a third device region and a forth device region. The first device region is arranged adjacent to the first conductor on the substrate. The second device region is arranged adjacent to the first device region on the substrate and is arranged beneath the second conductor. The third device region is arranged adjacent to the second device region on the substrate and is arranged beneath the third conductor. The fourth device region is arranged between the third device region and the fourth conductor on the substrate.

14 Claims, 6 Drawing Sheets

US 7,707,521 B2

LAYOUT ARCHITECTURE HAVING HIGH-PERFORMANCE AND HIGH-DENSITY DESIGN

BACKGROUND OF THE INVENTION

1. Field of the Invention

The present invention relates to a layout architecture. More particularly, the present invention relates to a layout architecture having high-performance and high-density design.

2. Description of Related Art

FIG. 1 is a layout architecture of conventional standard cells. The conventional standard cells C1-C4 are arranged between a conductor T1 and a conductor T2, and can function as, for example, an amplifier, an adder, a multiplier, and a phase inverter, respectively. Therefore, the standard cells C1-C4 have different widths W1-W4 depending on the complexity of the functions. In FIG. 1, the width W4 is larger than the width W2, thus the layout area of the standard cell C4 is larger than that of the standard cell C2 when having the same height H1. Therefore, the standard cell C4 is suitable for serving as a layout architecture of a circuit with complicated design or a high drive current, while the standard cell C2 is suitable for serving as a layout architecture of a circuit with simple design or a low drive current.

FIG. 2A is a circuit block diagram of a conventional logic device cell. FIG. 2B is a layout view of the conventional logic device cell in FIG. 2B. First, referring to FIG. 2A, the logic device cell in FIG. 2A comprises a pre-driver 20 and a driver 21 for outputting a logic operation signal. The AND gates G1 and G2 of the pre-driver 20 perform logic operation on an input signal and then outputs it into a NOR gate G3, and the NOR gate G3 performs logic operation on the input signal and then outputs it through a buffer B1 of the driver 21.

In the layout shown in FIG. 2 where the pre-driver 20 in FIG. 2A is working, conductors 201 and 204 have a supply voltage VCC and a ground voltage GND, and are respectively connected to a P-type metal oxide semiconductor (PMOS) region 202 and an NMOS region 203. A rectangle layout is formed between the conductors 201 and 204 to function as the pre-driver 20. The driver 21 comprises a PMOS region 212, an NMOS region 213, and the conductors 201 and 204. The driver 21 is different from the pre-driver 20 in that, since the driver 21 needs a high current, the PMOS region 212 and the NMOS region 213 of the driver 21 need a large layout area. However, under the circumstance that the conductors 201-204 have the same height, the layout width of the driver 21 must be larger than that of the pre-driver 20, thereby causing an excessive width of the whole layout. If the layout area is increased by increasing the height between the conductors 201 and 204, although the layout width of the driver 21 is greatly decreased, the area of other standard cells (such as the pre-driver 20) arranged between the conductors 201 and 204 is increased accordingly. However, since the pre-driver 20 is a low-current structure and needs a small device area, the layout area of the pre-driver 20 is wasted due to the inefficient utilization of area.

FIG. 3 is a view of a layout architecture for a logic cell disclosed in U.S. Pat. No. 6,838,713. Referring to FIG. 3, the conventional technology may solve the problem that the conventional driver 21 needs a large layout width, as shown in FIG. 1. A PMOS region 322 of a driver 32 is arranged beneath a conductor 302. As such, the driver 32 can realize the device layout under the height of conductors 301 and 303, and a pre-driver 31 is arranged between the conductors 301 and 302, and has a low height. Such a design may avoid wasting of the layout area of the pre-driver 31. However, one main disadvantage of such a layout architecture is that the architecture adopts a discrete form for the area of the NMOS regions 312 and 323, instead of the PMOS region 322 which appears in the form of a whole block. Due to such discrete form, some of the circuits cannot be shared and should be designed repeatedly, such that the complexity is increased and some layout area is wasted. Besides, the connecting wire is so long that it is difficult for routing.

SUMMARY OF THE INVENTION

Accordingly, one objective of the present invention is to provide a layout architecture having high performance and high-density design with complete and symmetric device regions, thereby greatly reducing the layout area and achieving a high-density layout architecture. Furthermore, the layout architecture may efficiently utilize the layout area and satisfy the requirement of high-performance design.

A further objective of the present invention is to provide a layout architecture of high-performance and high-density design, that can reduce the layout area, increase the design flexibility, achieve a high-density layout architecture, perform high-performance design, and increase driving capability.

The layout architecture of a standard cell provided by the present invention is suitable for an integrated circuit. The layout architecture comprises a substrate, a first conductor, a second conductor, a third conductor, a fourth conductor, a first device region, a second device region, a third device region and a forth device region. The first conductor, the second conductor, the third conductor, and the fourth conductor are arranged on the substrate and are used to respectively transmit a first voltage, a second voltage, a third voltage and a fourth voltage. The first device region is arranged on the substrate and adjacent to the first conductor. The second device region is arranged on the substrate and adjacent to the first device region, and is arranged beneath the second conductor. The third device region is arranged on the substrate and adjacent to the second device region, and is arranged beneath the third conductor. The forth device region is arranged on the substrate and between the third device region and the forth conductor.

The present invention further provides a layout architecture having high-performance and high-density design suitable for a standard cell integrated circuit. The layout architecture comprises a substrate, a first layout region, and a second layout region. The first layout region comprises a first conductor, a second conductor, a third conductor, a fourth conductor, a first device region, a second device region, a third device region and a fourth device region. The first conductor, the second conductor, the third conductor and the fourth conductor are arranged on the substrate for respectively transmitting a first voltage, a second voltage, a third voltage and a fourth voltage. The first device region is arranged on the substrate and adjacent to the first conductor. The second device region is arranged on the substrate and adjacent to the first device region, and is arranged beneath the second conductor. The third device region is arranged on the substrate and adjacent to the second device region, and is arranged beneath the third conductor. The fourth device region is arranged on the substrate and between the third device region and the fourth conductor.

The second layout region connected to the first layout region comprises a fifth conductor, a sixth conductor, a fifth device region and a sixth device region. The fifth conductor and the sixth conductor are arranged on the substrate for respectively transmitting a fifth voltage and a sixth voltage. The fifth device region is arranged on the substrate and adjacent to the fifth conductor. The sixth device region is arranged on the substrate and between the fifth device region and the sixth conductor.

The present invention employs the architecture with two conductors respectively arranged on two device regions. As such, not only the areas of the two conductors are used in the layout and two complete areas of two conductors are used in the layout and are symmetric, but also efficient design can be used to achieve a high-density architecture, and a large-scale layout is used to perform high-performance design and enhance the driving capability.

In order to the make aforementioned and other objects, features and advantages of the present invention comprehensible, preferred embodiment accompanied with figures are described in detail below.

DESCRIPTION OF EMBODIMENTS

Figure 1:
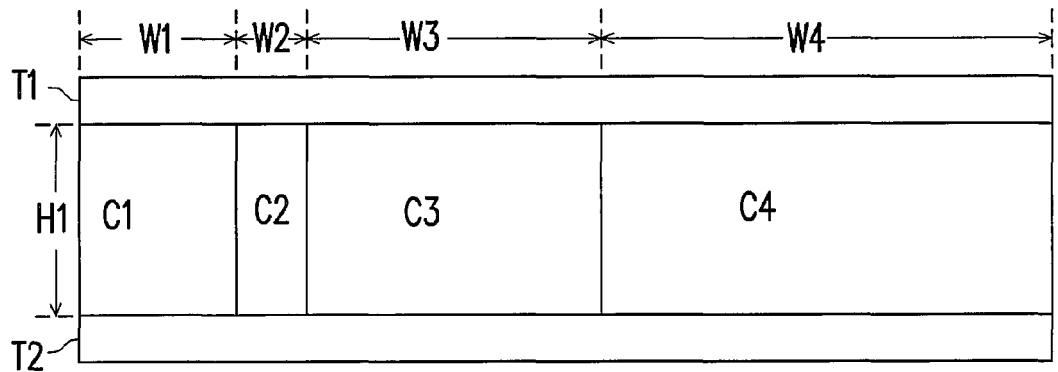
FIG. 1 is a layout view of a conventional layout architecture.
Figure 2A:
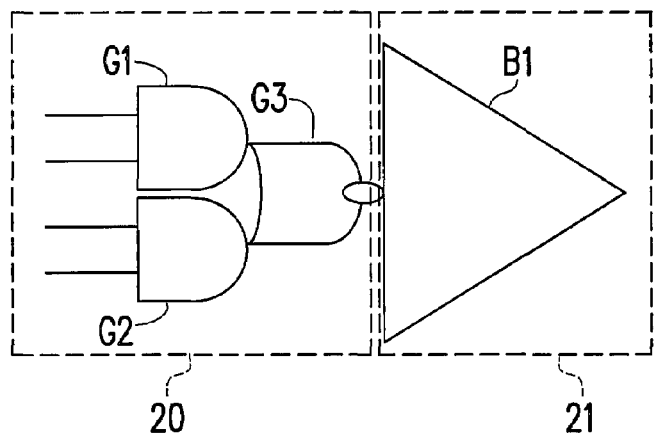
FIG. 2A is a circuit block diagram of a conventional logic device cell.
Figure 2B:
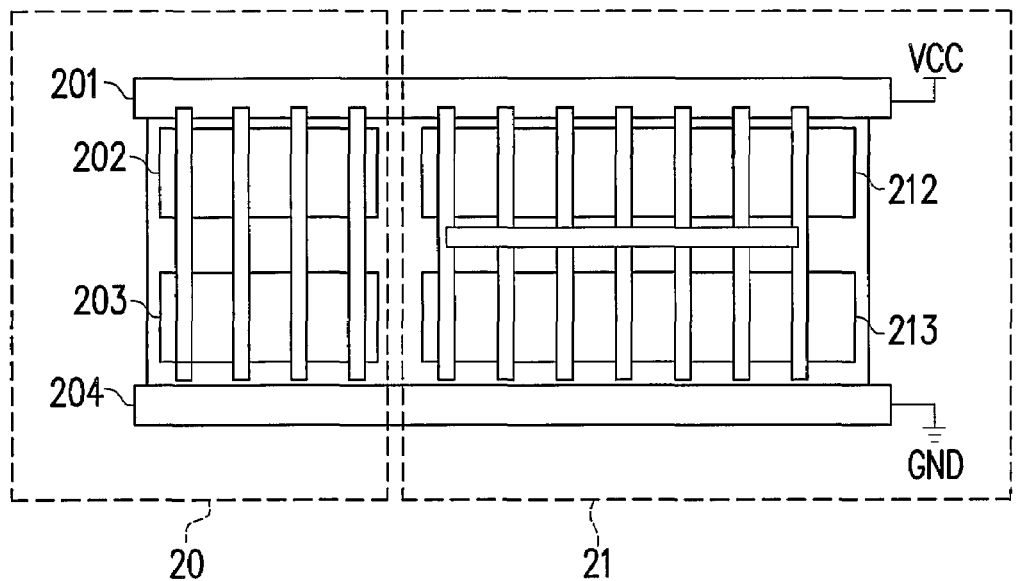
FIG. 2B is a layout view of the conventional logic device cell in FIG. 2B.
Figure 3:
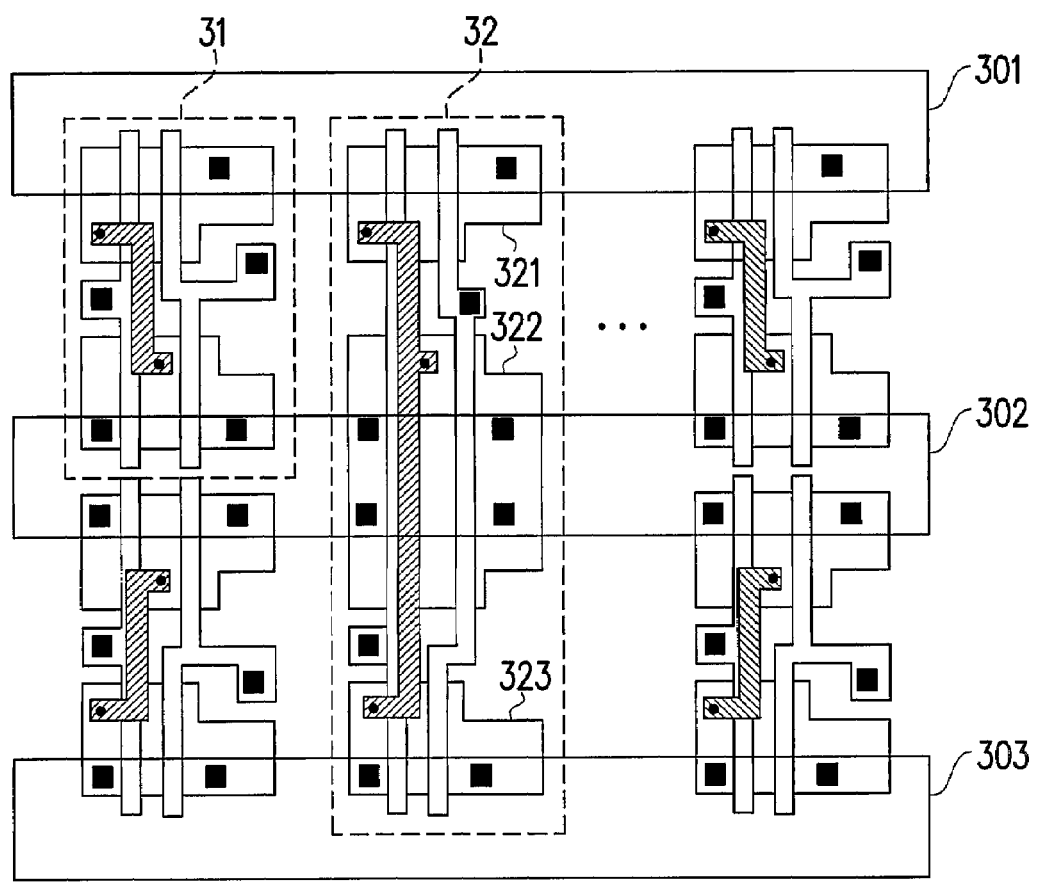
FIG. 3 is a layout view of a conventional layout architecture for a logic cell.
Figure 4:
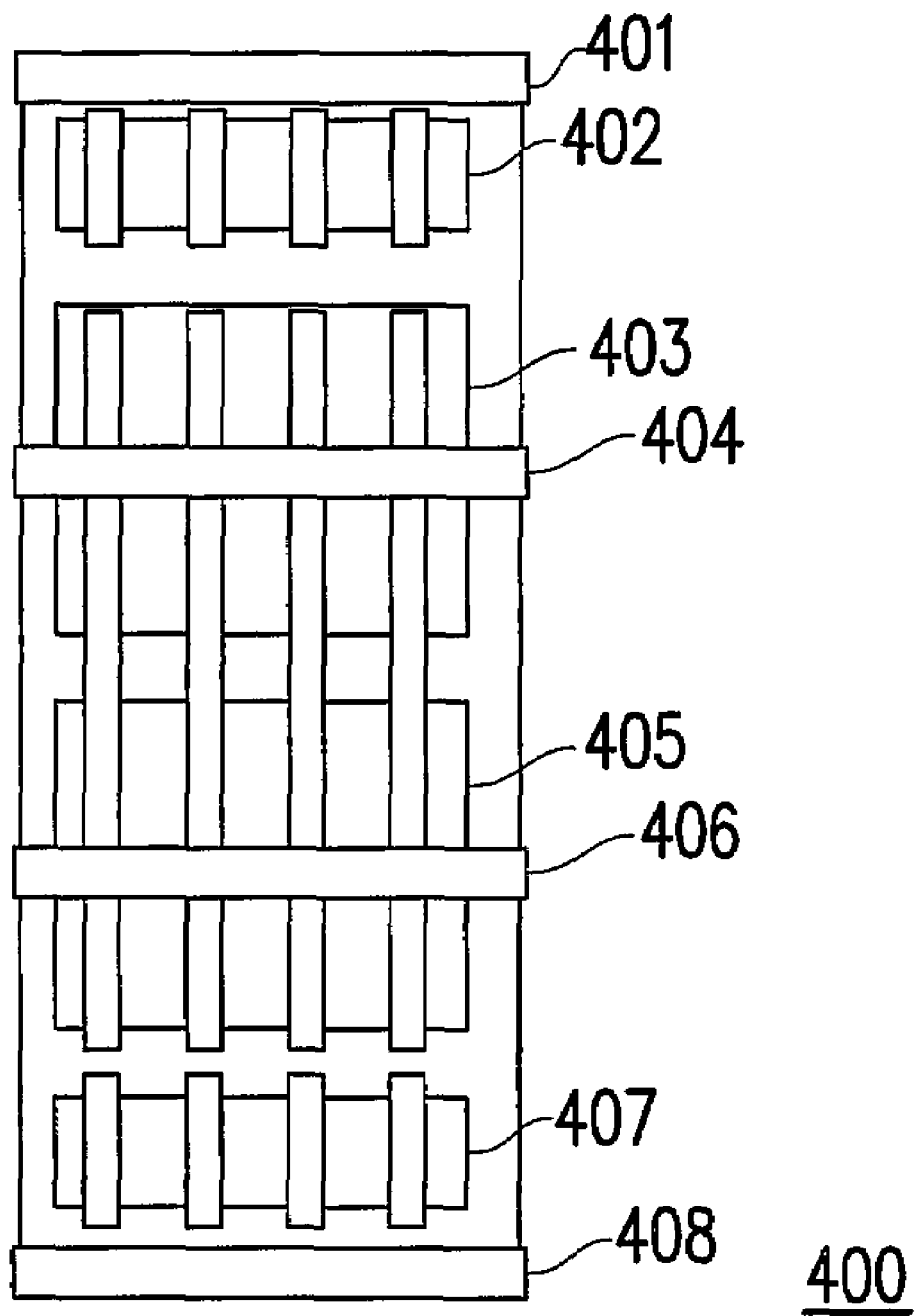
FIG. 4 is a layout view of a layout architecture 400 having high performance and high density according to one embodiment of the present invention.

FIG. 4 is a layout view of a layout architecture 400 having high performance and high density according to one embodiment of the present invention. A standard cell 400 includes a substrate (not shown) comprising conductors 401, 404, 406, and 408 and device regions 402, 403, 405, and 407 arranged thereon. The conductors 401 and 406 have a voltage VCC, and the conductors 404 and 408 have a voltage GND.

The device region 402 has a plurality of PMOS transistors arranged thereon, the device region 402 is connected to the conductor 401 to obtain the voltage VCC, and the device region 402 is connected to the device region 403. The device region 403 has a plurality of NMOS transistors arranged thereon, the device region 403 is connected to the device regions 402 and 405 and is arranged beneath the conductor 404. The device region 403 is connected to the conductor 404 to obtain the voltage GND. The device region 405 has a plurality of PMOS transistors arranged thereon, the device region 405 is connected to the device regions 403 and 407, and is arranged beneath the conductor 406. The device region 405 is connected to the conductor 406 to obtain the voltage VCC. The device region 407 has a plurality of NMOS transistors arranged thereon, the device region 407 is connected to the conductor 408 to obtain the voltage GND, and the device region 407 is connected to the device region 405.

As for the standard cell 400 in the present embodiment, the device regions 402 and 405 are PMOS regions, and the device regions 403 and 407 are NMOS regions. The PMOS device region 403 and the PMOS device region 405 are two symmetric and complete device regions beneath the conductors 404 and 406. Due to such symmetry and completeness, the length of the wire may be decreased to achieve high-density of the layout. Meanwhile, the device regions 403 and 405 are arranged beneath the conductors 404 and 406, such that the layout area will be continuous because of the existence of the conductors 404 and 406. Furthermore, since the available layout area is increased, the layout area of each device region is increased, thereby achieving high-performance design. The present embodiment is used in the layout design of a logic cell.

In the present embodiment, two complete device regions are arranged beneath two conductors, so as to form a symmetric layout, such as NMOS layout and PMOS layout. Furthermore, the area beneath the two conductors may be used for layout, thereby reducing the wasting of the layout area.

Figure 5:
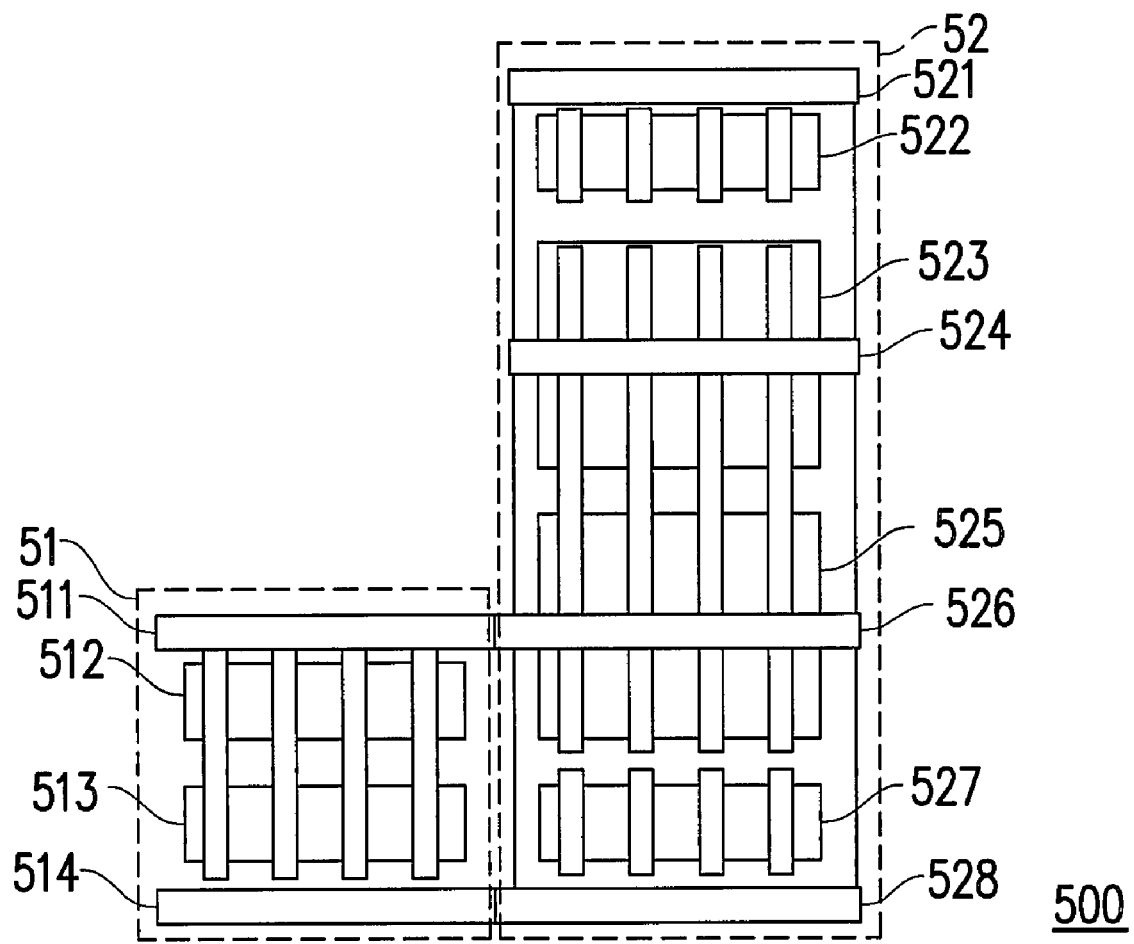
FIG. 5 is a layout view of a layout architecture 500 having high performance and high density according to another embodiment of the present invention.

FIG. 5 is a layout view of a layout architecture of a standard cell 500 having high performance and high density according to another embodiment of the present invention. The standard cell 500 includes a substrate (not shown), wherein a first layout region 51 and a second layout region 52 are arranged on the substrate. The first layout region 51 includes a conductor 511, a device region 512, a device region 513, and a conductor 514. The conductor 511 has a voltage VCC and the conductor 514 has a voltage GND.

The device region 512 has a plurality of PMOS transistors arranged thereon, and the device region 512 is connected to the conductor 511 to obtain the voltage VCC. The device region 513 has a plurality of NMOS transistors arranged thereon, the device region 513 is connected to the conductor 514 to obtain the voltage GND, and the device region 513 is also connected to the device region 512. The second layout region 52 includes conductors 521, 524, 526, and 528 and active device regions 522, 523, 525, and 527. The layout of the second layout region 52 is the same as that of the layout architecture 400 shown in FIG. 4.

In the first layout region 51 of the present embodiment, an input signal accepts logic operation, and then is output through the second layout region 52. Since the first layout region 51 processes a low current signal or simple logic operation through a small area, and the second layout device 52 processes a high current signal or complicated logic operation through a large area, an L-shaped layout architecture can satisfy different requirements based on the area of the first layout region 51 and the second layout region 52. Furthermore, the device regions 524 and 526 of the second layout region 52 are arranged beneath the two conductors, the area beneath the two conductors is available and ensures the completeness, thereby having a preferable high-density layout area and achieving high performance.

Figure 6:
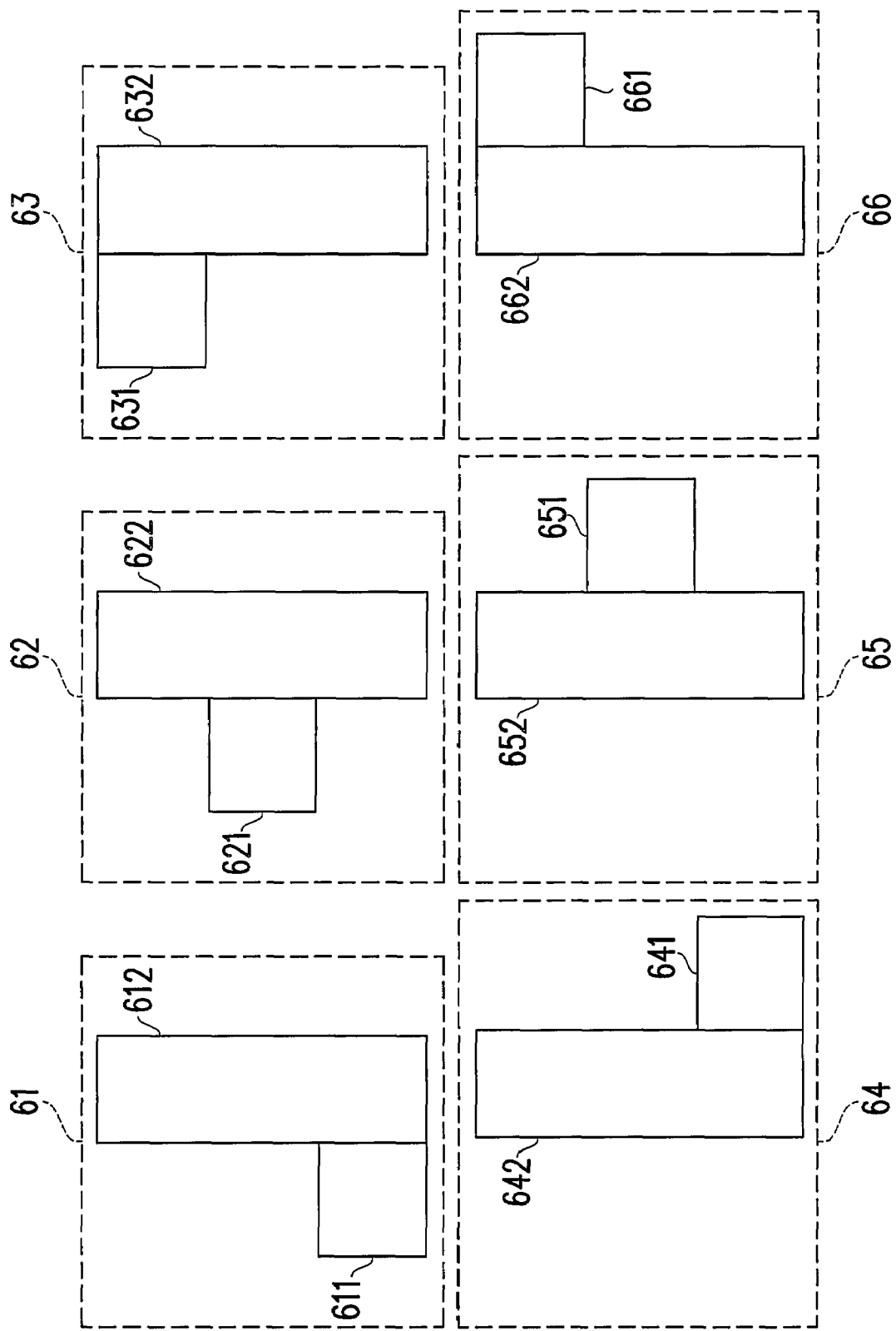
FIG. 6 is a distribution view of the positions of a first layout region and a second layout region according to one embodiment of the present invention.

FIG. 6 is a distribution view of the positions of the first layout region and the second layout region according to one embodiment of the present invention. The first layout region and the second layout region are not limited to the L-shaped structure in the embodiment shown in FIG. 5 and may be an architecture of connecting any side of the first layout region and any side of the second layout region. In the layout architectures 61-66, the first layout regions 611, 621, 631, 641, 651 and 661 input a signal to the second regions 612, 622, 632, 642, 652 and 662, and the positional relationship between the first layout region and the second layout region may increase the flexibility in designing a circuit.

The present embodiment of the present invention employs a layout architecture of combining the first layout region and the second layout region. The second layout region is triple as high as the first layout region, and the first layout region is connected to the second layout region. As for the second layout region, since two device regions are arranged beneath two conductors, the area beneath the conductors is available for forming two complete device regions, thereby saving the layout area.

Figure 7:
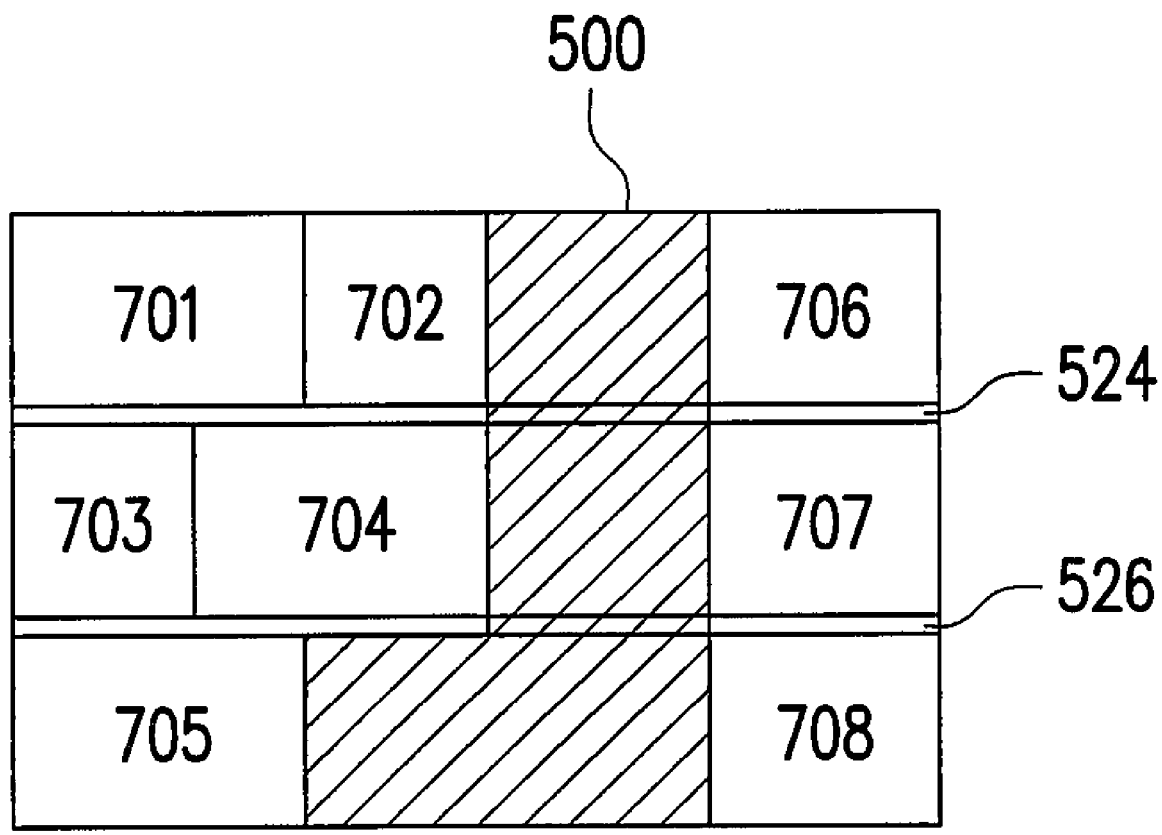
FIG. 7 is a layout view of a drive unit containing the layout architecture 500 according to one embodiment of the present invention.

FIG. 7 is a layout view of a drive unit containing the standard cell 500 according to one embodiment of the present invention. The drive unit includes standard cells 701-708 and 500. The standard cell 500 may be designed to perform a high drive functional design, such as a high current design, due to large area layout architecture, while the standard cells 701-708 performs a common drive functional design, such as a low current design.

In view of the above, as for the high-performance and high-density design of the present invention, since two conductors are arranged above two active device regions symmetrically, two complete active device regions are achieved to realize a high-density architecture.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layout architecture of a standard cell, suitable for an integrated circuit, comprising:
    a substrate;
    a first conductor, arranged on the substrate for transmitting a first voltage;
    a second conductor, arranged on the substrate for transmitting a second voltage;
    a third conductor, arranged on the substrate for transmitting a third voltage;
    a fourth conductor, arranged on the substrate for transmitting a fourth voltage;
    a first device region, arranged on the substrate and adjacent to the first conductor;
    a second device region, arranged on the substrate, adjacent to the first device region, and beneath the second conductor;
    a third device region, arranged on the substrate, adjacent to the second device region, and beneath the third conductor; and
    a fourth device region, arranged on the substrate and between the third device region and the fourth conductor,
    wherein each of the first, the second, the third, and the fourth conductors is parallel to each other, the first device region is arranged between the first conductor and the second device region, the second device region is arranged between the first and the third device regions, and the third device region is arranged between the second and the fourth device regions.

2. The layout architecture of a standard cell as claimed in claim 1, wherein the second device region is electrically connected to the second conductor to obtain the second voltage.

3. The layout architecture of a standard cell as claimed in claim 1, wherein the third active device region is electrically connected to the third conductor to obtain the third voltage.

4. The layout architecture of a standard cell as claimed in claim 1, wherein the first voltage and the third voltage are supply voltage.

5. The layout architecture of a standard cell as claimed in claim 1, wherein the second voltage and the fourth voltage are ground voltage.

6. The layout architecture of a standard cell as claimed in claim 1, wherein the first device region and the second device region are P-type metal oxide semiconductor (PMOS) transistor regions.

7. The layout architecture of a standard cell as claimed in claim 1, wherein the second device region and the fourth device region are N-type metal oxide semiconductor (NMOS) transistor regions.

8. A layout architecture of a standard cell, suitable for an integrated circuit, comprising:
    a substrate;
    a first layout region, comprising:
        a first conductor, arranged on the substrate for transmitting a first voltage;
        a second conductor, arranged on the substrate for transmitting a second voltage;
        a third conductor, arranged on the substrate for transmitting a third voltage;
        a fourth conductor, arranged on the substrate for transmitting a fourth voltage;
        a first device region, arranged on the substrate and adjacent to the first conductor;
        a second device region, arranged on the substrate, adjacent to the first device region, and beneath the second conductor;
        a third device region, arranged on the substrate, adjacent to the second device region, and beneath the third conductor; and
        a fourth device region, arranged on the substrate and between the third device region and the fourth conductor; and
    a second layout region, adjacent to the first layout region, comprising:
        a fifth conductor, arranged on the substrate for transmitting a fifth voltage;
        a sixth conductor, arranged on the substrate for transmitting a sixth voltage;
        a fifth device region, arranged on the substrate and adjacent to the fifth conductor; and
        a sixth device region, arranged on the substrate and between the fifth device region and the sixth conductor,
    wherein each of the first, the second, the third, and the fourth conductors is parallel to each other, the first device region is arranged between the first conductor and the second device region, the second device region is arranged between the first and the third device regions, and the third device region is arranged between the second and the fourth device regions.

9. The layout architecture of a standard cell as claimed in claim 8, wherein the second device region is electrically connected to the second conductor to obtain the second voltage.

10. The layout architecture of a standard cell as claimed in claim 8, wherein the third active device region is electrically connected to the third conductor to obtain the third voltage.

11. The layout architecture of a standard cell as claimed in claim 8, wherein the first voltage, the third voltage, and the fifth voltage are supply voltage.

12. The layout architecture of a standard cell as claimed in claim 8, wherein the second voltage, the fourth voltage, and the sixth voltage are ground voltage.

13. The layout architecture of a standard cell as claimed in claim 8, wherein the first device region, the third device region, and the fifth device region are PMOS transistor regions.

14. The layout architecture of a standard cell as claimed in claim 8, wherein the second device region, the fourth device region, and the sixth device region are NMOS transistor regions.

* * * * *